(12) United States Patent  (10) Patent No.: US 8,740,411 B2
Yong et al.  (45) Date of Patent: Jun. 3, 2014

(54) PLASTIC LEADED CHIP CARRIER WITH DIAGONALLY ORIENTED LIGHT SOURCES FOR FINE-PITCHED DISPLAY

(71) Applicant: Avago Technologies General IP (Singapore) Pte. Ltd., Yishun (SG)

(72) Inventors: Lig Li Yong, Penang (MY); Keat Chuan Ng, Penang (MY); Yean Chon Yaw, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/632,977

(22) Filed: Oct. 1, 2012

(65) Prior Publication Data
US 2014/0091340 A1 Apr. 3, 2014

(51) Int. Cl.
*F21S 4/00* (2006.01)
(52) U.S. Cl.
USPC .................................................. 362/249.02

(58) Field of Classification Search
USPC ........ 257/98–100; D13/180, 182; 362/249.02
See application file for complete search history.

(56) References Cited

U.S. PATENT DOCUMENTS

| 6,177,761 | B1 | 1/2001 | Pelka et al. |
| 7,524,087 | B1 * | 4/2009 | Aizar et al. .................... 362/267 |
| 7,766,509 | B1 | 8/2010 | Laporte |
| 7,829,899 | B2 | 11/2010 | Hutchins |
| 8,120,240 | B2 | 2/2012 | Brandes |
| 2010/0164346 | A1 * | 7/2010 | Li et al. .......................... 313/46 |
| 2010/0181582 | A1 * | 7/2010 | Li et al. .......................... 257/91 |
| 2010/0195333 | A1 | 8/2010 | Schaefer et al. |
| 2012/0307481 | A1 * | 12/2012 | Joo et al. ....................... 362/97.1 |
| 2013/0003375 | A1 * | 1/2013 | Hussell ..................... 362/249.02 |

* cited by examiner

*Primary Examiner* — Matthew Reames
*Assistant Examiner* — Nicholas J Choi (57) ABSTRACT

A Plastic Leaded Chip Carrier (PLCC) package is disclosed. The PLCC package is configured to support a plurality of light sources. The light sources may be mounted on a mounting section of the PLCC package's lead frame and the mounting section of the lead frame may extend diagonally with respect to the housing of the lead frame.

20 Claims, 5 Drawing Sheets

PLASTIC LEADED CHIP CARRIER WITH DIAGONALLY ORIENTED LIGHT SOURCES FOR FINE-PITCHED DISPLAY

FIELD OF THE DISCLOSURE

The present disclosure is generally directed toward light emitting devices and packages for the same.

BACKGROUND

Light Emitting Diodes (LEDs) have many advantages over conventional light sources, such as incandescent, halogen and fluorescent lamps. These advantages include longer operating life, lower power consumption, and smaller size. Consequently, conventional light sources are increasingly being replaced with LEDs in traditional lighting applications. As an example, LEDs are currently being used in flashlights, camera flashes, traffic signal lights, automotive taillights and display devices.

Two prevalent types of LED form factors are surface-mount LEDs and thru-hole LEDs. Surface-mount LEDs are desirable for applications which require a low LED profile. Among the various packages for surface-mount LEDs, an LED package of interest is the Plastic Leaded Chip Carrier (PLCC) package. Surface mount LEDs in PLCC packages may be used, for example, in automotive interior display devices, electronic signs and signals, and electrical equipment.

While PLCC packages are well designed for a single light source, they pose some challenges and limitations for multi-source applications (e.g., RGB lighting). First, PLCC packages are limited in their ability to tune and modulate the radiation pattern via the surrounding plastic-molded reflector housing. Second, PLCC packages are limited in their ability to increase luminous intensity on a targeted viewing angle due to no direct effective reflector being in close proximity to the light source. Third, the incorporation of reflector cups for RGB lighting will incur a significant increase in the package form factor, which will, in turn, lower the display resolution.

SUMMARY

It is, therefore, one aspect of the present disclosure to provide a lighting package, such as a PLCC package that overcomes the above-noted shortcomings. In particular, a PLCC package is disclosed that includes a plurality of light sources. The disclosed PLCC package, in some embodiments, enables the fine pitch arrangement of approximately 4 mm or less for an RGB LED.

The disclosed PLCC package also enables a minimal form factor, thereby maintaining the display resolution provided by the PLCC package. In particular, a PLCC package built in accordance with embodiments disclosed herein can be as small as 3.5 mm×3.5 mm, even with the incorporation of three light sources having dimensions of approximately 15 mil×15 mil and even with the three light sources being mounted in individual reflector cups.

The disclosed PLCC package also enables the modulation of radiation patterns and viewing angles with the reflector cups. Specifically, the configuration of light sources with the PLCC package enables each light source to have its own dedicated reflector cup. Each reflector cup in the PLCC package can be used to control radiation patterns and viewing angles for each light source.

In some embodiments, a package configured to support two or more light sources is provided that includes a lead frame having a mounting section and at least one lead electrically insulated from the mounting section. The package also includes a housing having a first corner and a second corner that is diagonally-disposed relative to the first corner and that is separated from the first corner by at least two edges of the housing. The mounting section of the lead frame extends in a direction that is generally parallel to a line between the first corner and second corner.

A method of manufacturing a package configured to support two or more light sources is also provided that includes receiving a lead frame having a mounting section and at least one lead electrically insulated from the mounting section, forming a housing around the lead frame such that the mounting section of the lead frame is exposed at a top light-emitting surface of the housing and such that the mounting section extends between two corners of the housing, where the two corners include a first corner being separated from a second corner by at least two edges of the housing and being diagonally-disposed relative to the second corner.

The present disclosure will be further understood from the drawings and the following detailed description. Although this description sets forth specific details, it is understood that certain embodiments of the invention may be practiced without these specific details. It is also understood that in some instances, well-known circuits, components and techniques have not been shown in detail in order to avoid obscuring the understanding of the invention.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Furthermore, although the depicted PLCC packages correspond to a conventional C-bend PLCC package, embodiments of the present disclosure are not so limited. In particular, embodiments of the present disclosure can be utilized in any type of known PLCC package and/or platform. Specifically, any type of PLCC package and/or platform or similar type of package for light emitting devices that uses a plastic molded lead frame can incorporate one or more features disclosed herein. Suitable types of PLCC packages that may incorporate embodiments of the present disclosure include, without limitation, a Moonstone Package which has one or more leads protruding to its side, an L-bend PLCC, a PLCC with one or more leads protruding from its bottom, and so on. In some embodiments, the PLCC package may be manufactured according to the industry standard PLCC-4.

Figures 1A, 1B:
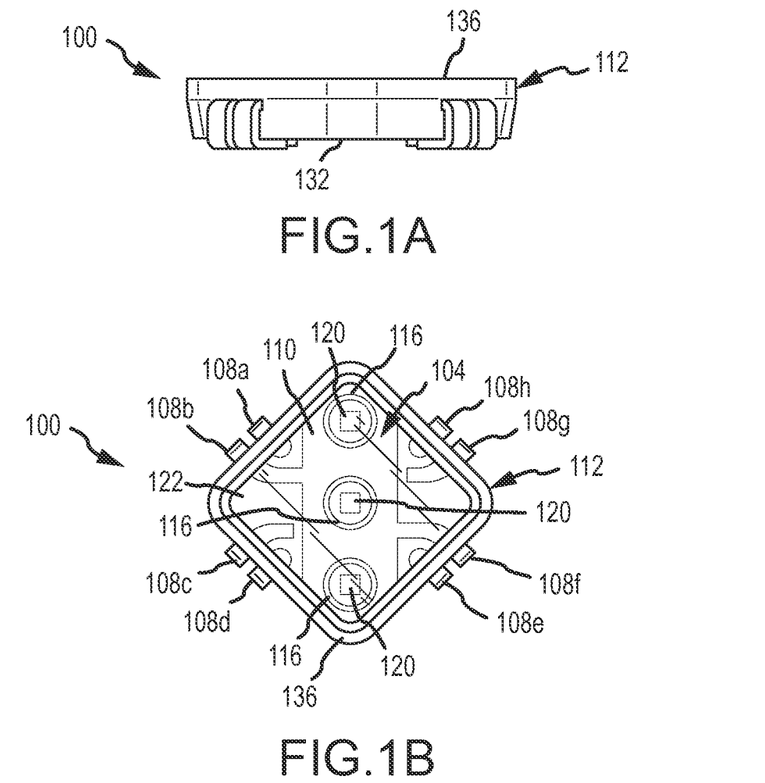
FIG. 1A is a side view of a first PLCC package in accordance with embodiments of the present disclosure.
FIG. 1B is a top view of the first PLCC package depicted in FIG. 1A.
Figure 1C:
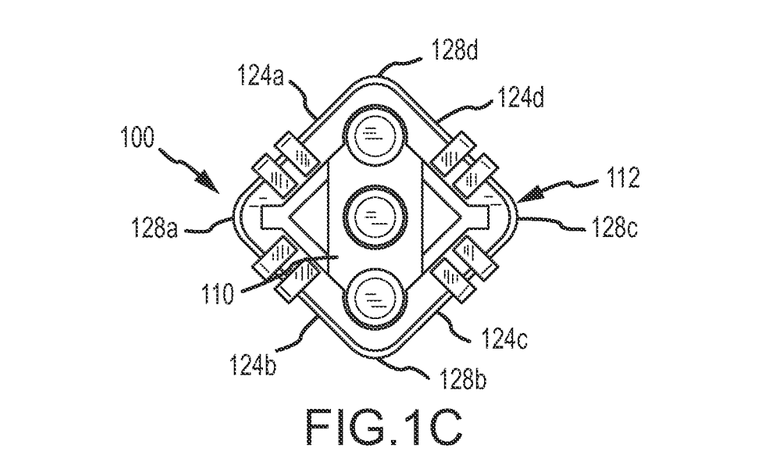
FIG. 1C is a bottom view of the first PLCC package depicted in FIG. 1A.

With reference now to FIGS. 1A-C, a first PLCC package 100 will be described in accordance with at least some embodiments of the present disclosure. The first PLCC package 100 may comprise a lead frame 104 and a housing 112 that surrounds the lead frame 104. The lead frame 104 may comprise a plurality of leads 108. The leads 108 may be provided to supply electrical current to light sources 120 mounted thereto. In some embodiments, the lead frame 104 and housing 112 may comprise a plurality of reflector cups 116. Each reflector cup 116 may correspond to a depression and/or raised wall in the lead frame 104 that is configured to house and surround the one or more light sources 120. In some embodiments the reflector cups 116 as well as a cavity established by an upper part of the housing (e.g., a cavity between an upper surface of the lead frame 104 and an upper surface of the housing 112 on the light-emitting surface 136 of the package 100) may be partially or completely filled with an encapsulant 122. The encapsulant 122 may be maintained in the housing 112 by lips or an outer ridge that follow side edges 124a-d and corners 128a-d of the housing 112. In some embodiments, a single encapsulant 122 fills the cavity established in the upper part of the housing 112 as well as the reflector cups 116.

In some embodiments, the housing 112 is made of a plastic material, such as Polyphthalamide (PPA). Of course, the housing 112 may be made of other types of materials such as any other type of polymer or combination of polymers. In some embodiments, the housing 112 may be constructed of any polymer or combination of polymers using extrusion, machining, micro-machining, molding, injection molding, trimming, or a combination of such manufacturing techniques.

In the embodiments depicted in FIGS. 1A-C, the leads 108 of the lead frame 104 are exposed in the bottom of the cavity established in the upper part of the housing 112. The leads 108 may then extend or pass through part of the housing 112 to an outer surface (e.g., side edge(s) 124a-d and/or bottom surface 132) of the housing 112, thereby facilitating attachment of the PLCC package 100 to an electrical circuit (e.g., bonding pads on a Printed Circuit Board (PCB)). Although the leads 108 of the lead frame 104 extending to the outer surface of the housing 112 are depicted a C-leads, embodiments of the present disclosure are not so limited. In particular, any other type or shape of leads may be utilized such as, for example, SOJ leads, gull wing leads, reverse gull wing leads, and straight cut leads.

The lead frame 104 also comprises a mounting section 110 that extends diagonally across the housing 112. In particular, the example depicted in FIGS. 1A-C shows that the mounting section 110 extends in a direction substantially parallel to a line drawn between the fourth corner 128d and the second corner 128b. The diagonal orientation of the mounting section 110 of the lead frame 104 facilitates the mounting of multiple light sources 120 within the housing 112 without requiring a substantial increase in the size of the housing 112. In some embodiments, no increase in the size of the housing 112 is required to accommodate the multiple light sources 120 as compared to housings 112 configured to house a single light source and reflector cup 116.

In some embodiments, the mounting section 110 is configured to support a plurality of light sources 120. In other words, the mounting section 110 may have a plurality of light sources 120 mounted or attached thereto. The light sources 120 may also be mounted on a line that extends from diagonally-disposed corners 128b, 128d of the housing 112. Again, mounting of the light sources 120 in this configuration enables a smaller package 100 to be used even though multiple light sources 120 are mounted on the mounting section 110.

The reflector cups 116 may be formed as a depression or raised wall in a top surface of the mounting section 110. In some embodiments, the interior cylindrical (or conical) surface of the reflector cups 116 partially comprises the material of the lead frame 104 (e.g., metal). It may also be possible to include non-metal material in the reflector cups 116 without departing from the scope of the present disclosure.

In some embodiments, the interior cylindrical (or conical) surface of each reflector cup 116 is configured to increase the brightness of the PLCC package 100 (e.g., by virtue of the fact that the interior cylindrical (or conical) surface of the reflector cup 116 comprises the highly reflective metal of the lead frame 104). Moreover, the reflector cups 116 can be configured to direct light emitted by the light sources 120 in a predetermined direction or at a predetermined viewing angle.

The material selected for the housing 112 may also be selected to increase the contrast of the PLCC package 100. In particular, the housing 112 may comprise a black or dark colored plastic that increases the contrast of the PLCC package 100.

Each of the light sources 120, in some embodiments, comprises an LED. The embodiment depicted in FIG. 1 shows a PLCC package 100 that comprises three light sources 120. It should be appreciated that a greater or lesser number of light sources 120 may be attached to the mounting section 110. Specifically, the package 100 can be configured to support two, three, four, five, six, seven, . . . , twenty, or more light sources 120 without departing from the scope of the present disclosure. The number of light sources 120 provided in the package 100 can depend on the size of the light sources 120, the size of the housing 112, and any other design consideration.

In some embodiments, each light source 120 is configured to emit light of a different wavelength or color. More specifically, a first of the light sources 120 may be configured to emit light that is approximately red (e.g., with a wavelength of approximately 620-750 nm), a second of the light sources 120 may be configured to emit light that is approximately green (e.g., with a wavelength of approximately 495-570 nm), and a third of the light sources 120 may be configured to emit light that is approximately blue (e.g., with a wavelength of approximately 450-495 nm). By providing these three specific types of light sources 120, the package 100 can be configured as an RGB light source and can, therefore, produce an infinite number of colors by adjusting the relative amount of light produced by each light source 120.

Each light source 120 is connected to a different lead 108; accordingly, the lead frame 104 may comprise at least three leads 108 when there are three light sources 120. As can be appreciated, a greater or lesser number of leads 108 may be included in the PLCC package 100 without departing from the scope of the present disclosure.

The illustrative lead frame 104 comprises eight leads 108*a-h*, which ultimately represent eight pins for the package 100. As can be seen in FIG. 1B, some of the leads (e.g., second lead 108*b* and sixth lead 108*f*) may be electrically and physically directly connected to the mounting section 110 while some of the leads (e.g., first lead 108*a*, third lead 108*c*, fourth lead 108*d*, fifth lead 108*e*, seventh lead 108*g*, and eighth lead 108*h*) may be electrically insulated from the mounting section 110 by the material of the housing 112.

In the event that discrete control is desired for each of the light sources 120, the light sources 120 may correspond to LEDs that have both their anode and cathode on their top (light-emitting) surface. One known way to manufacture such an LED is by flip-chip manufacturing processes. As a non-limiting example, the anode of the first light source 120 (e.g., the top light source 120) may be electrically connected to the first lead 108*a* via a first bonding wire and the cathode of the first light source 120 may be electrically connected to the eighth lead 108*h* via a second bonding wire. The anode of the second light source 120 (e.g., the middle light source 120) may be electrically connected to the third lead 108*c* via a third bonding wire and the cathode of the second light source 120 may be electrically connected to the seventh lead 108*g* via a fourth bonding wire. The anode of the third light source 120 (e.g., the bottom light source 120) may be electrically connected to the fourth lead 108*d* via a fifth bonding wire and the cathode of the third light source 120 may be electrically connected to the fifth lead 108*e* via a sixth bonding wire. Accordingly, the three light sources may be individually controlled with signals transmitted to the appropriate leads. Thus, the package 100 having three light sources 120 may comprise eight leads 108*a-h*, where six of the leads are used to communicate with a light source and two of the leads are used to physically support the mounting section 110 during manufacture.

The diagonal orientation of the mounting section 110 may cause the placement of the leads 108*a-h* to be offset from the center of the side edges 124*a-d*. More specifically, it can be seen in FIGS. 1B and 1C that the housing 112 has a first side edge 124*a* extending between a first corner 128*a* and fourth corner 128*d*, a second side edge 124*b* extending between the first corner 128*a* and a second corner 128*b*, a third side edge 124*c* extending between the second corner 128*b* and a third corner 128*c*, and a fourth side edge 124*d* extending between the third corner 128*c* and the fourth corner 128*d*. The mounting section 110 extends between the fourth corner 128*d* and second corner 128*b*, which means that the leads 108*a-h* need to be shifted toward the other corners (e.g., first corner 128*a* and third corner 128*c*).

This shifting of the leads 108 enables the mounting section 110 to fit in the package 100 while maintaining electrical insulation between the mounting section 110 and at least some of the leads 108. Stated another way, because the mounting section 110 extends diagonally across the housing 112, each pair of leads on each side edge of the housing 112 are pushed away from the center of the side edge. In some embodiments, each side edge comprises at least two leads (e.g., first side edge 124*a* has a first lead pair, second side edge 124*b* has a second lead pair, third side edge 124*c* has a third lead pair, and fourth side edge has a fourth lead pair). Each lead in the lead pair is situated between a middle point of the side edge 124 and the corner of the housing. This maximizes space for the mounting section 110 at the opposite corners of the housing 112.

Although the housing 112 is depicted as having a substantially square configuration or shape (e.g., each side edge 124 is substantially the same length), embodiments of the present disclosure are not so limited. Specifically, a package may be constructed to have any type of shape or configuration (e.g., rectangular, circular, oval, or any other polygon).

Any number of materials may be suitable for use as the encapsulant 122. Examples of such materials include, without limitation, epoxy, silicone, a hybrid of silicone and epoxy, phosphor, a hybrid of phosphor and silicone, an amorphous polyamide resin or fluorocarbon, glass, plastic, or combinations thereof. In some embodiments, the encapsulant 122 completely fills the reflector cups 116 and the cavity established in the upper part of the housing 112. The embodiment depicted in FIGS. 1A-C shows that the encapsulant 122 is substantially planar or flat and has not light-directing features, such as a lens shape.

Figure 2A:
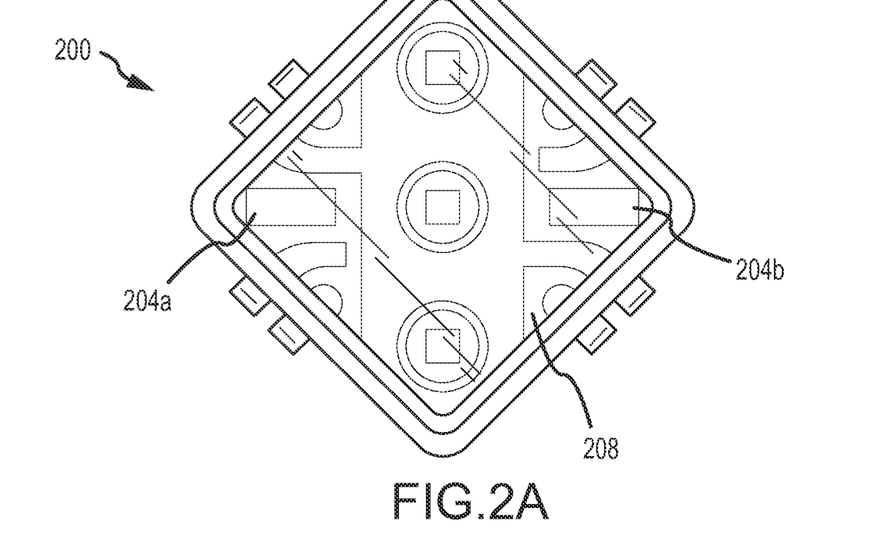
FIG. 2A is a top view of a second PLCC package in accordance with embodiments of the present disclosure.
Figure 2B:
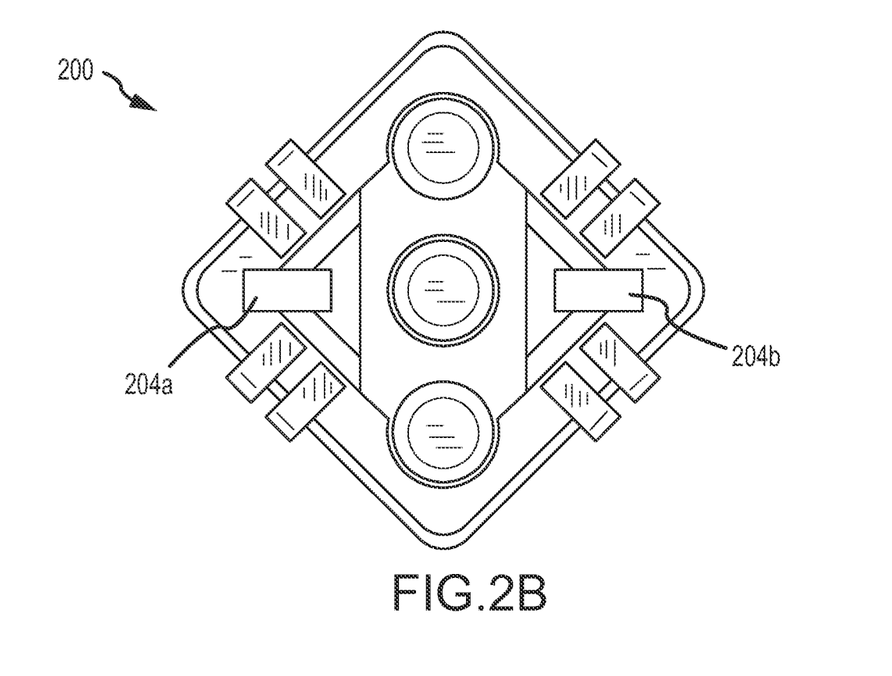
FIG. 2B is a bottom view of the second PLCC package depicted in FIG. 2A.

FIGS. 2A and 2B show a second PLCC package 200 that is similar to the first PLCC package 100 in many respects except that the second PLCC package 200 comprises one or more back-dispensing vias 204*a*, 204*b*. In some embodiments, the PLCC package 200 may only require one back-dispensing via 204. In other embodiments, three or more back-dispensing vias may be provided in the housing 112.

The back-dispensing vias 204*a*, 204*b* correspond to vias, voids, or holes in the material of the housing 112 that expose the cavity in the upper part of the housing 112 to the bottom surface 132 of the housing 112. Whereas the first PLCC package 100 may have the encapsulant 122 provided at the upper light-emitting surface 136, the second PLCC package may have encapsulant 208 provided at the bottom surface 132. The encapsulant 208 material may be injected through the vias 204*a*, 204*b* by one or more dispensing units. Moreover, the encapsulant 208 may be similar or identical to the encapsulant 122 except for the way in which the encapsulant 208 is provided to the package 200. In particular, the encapsulant 208 can be silicone or epoxy or hybrid epoxy. The encapsulant 208 may be provided with a pre-dip step followed by a back-dispensing step that is facilitated with the aid of production jigs and a mold cup (e.g., de-molding jigs, mold cups, etc.).

The second PLCC package 200 is similar to the first PLCC package 100 in that it also comprises an encapsulant 208 having a substantially planar or flat surface.

Figure 3A:
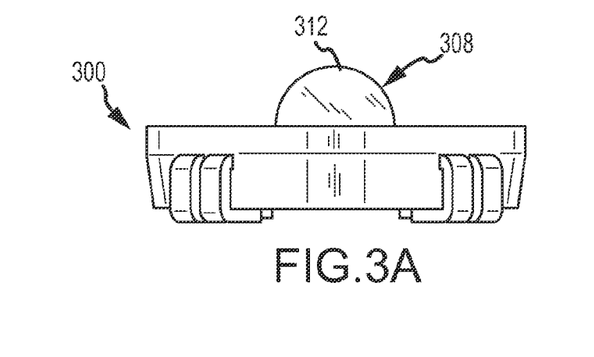
FIG. 3A is a first side view of a third PLCC package in accordance with embodiments of the present disclosure.
Figure 3B:
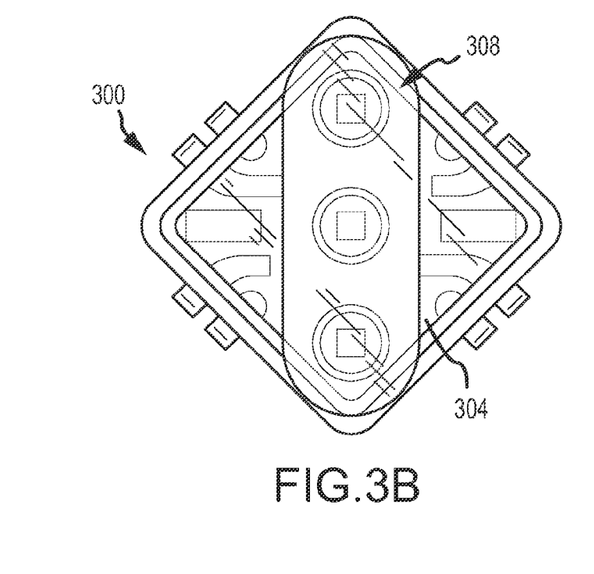
FIG. 3B is a top view of the third PLCC package depicted in FIG. 3A.
Figure 3C:
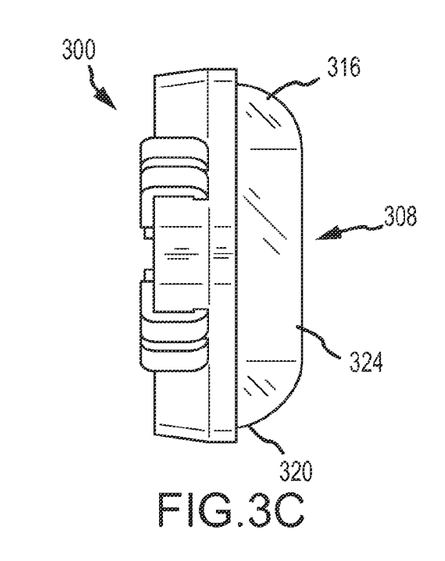
FIG. 3C is a second side view of the third PLCC package depicted in FIG. 3A.

FIGS. 3A-C depict a third PLCC package 300 that is similar to the first and second PLCC packages 100, 200 except that the third PLCC package 300 comprises a shared lens 308. In some embodiments, the shared lens 308 is formed with an encapsulant 304 that also fills the rest of the cavity in the upper part of the housing 112. As can be seen in FIG. 3A, a top surface of the shared lens 308 extends above the top surface of the housing 112. The shape of the shared lens 308 may be any shape and is not limited to the illustrative example depicted in FIGS. 3A-C. Moreover, the materials used for the encapsulant 304 may be similar or identical to the materials used for any other encapsulant described herein.

As can be seen in FIG. 3C, embodiments of the shared lens 308 can be designed to extend and cover each of the plurality of light sources 120. In particular, the shared lens 308 may comprise a first end 316 and second end 320 which are connected by a body portion 324. The body portion 324 may be shaped similar to a half of a cylinder and the ends 316, 320 may be shaped similar to quartered spheres. The body portion 324 may interface with the first end 316 at a point that is substantially directly over one of the light sources 120, such as the upper light source. Similarly, the body portion 324 may interface with the second end 320 at a point that is substantially directly over another of the light sources 120, such as the lower light source. Accordingly, the body portion 324 may extend over every light source 120 or at least portions of every light source 120.

The example PLCC package 300 depicted in FIGS. 3A-C also comprise back-dispensing vias 204*a*, 204*b*. In some embodiments, the shared lens 308 may be constructed by molding the encapsulant 304 with one or more molds that are placed over the top light-emitting surface of the housing 112 while the encapsulant 304 is dispensed into the cavity of the upper part of the housing 112 through the back-dispensing vias 204*a*, 204*b*.

Figure 4A:
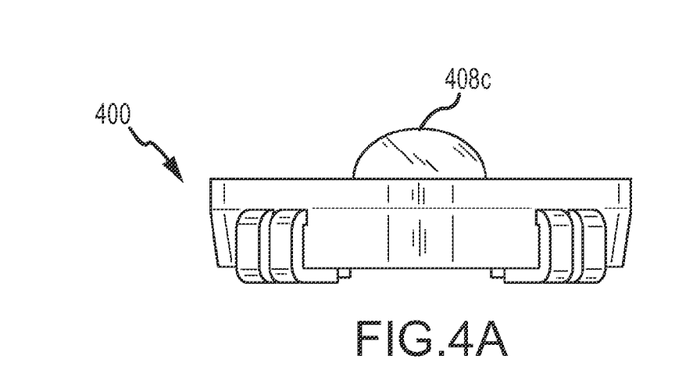
FIG. 4A is a first side view of a fourth PLCC package in accordance with embodiments of the present disclosure.
Figure 4B:
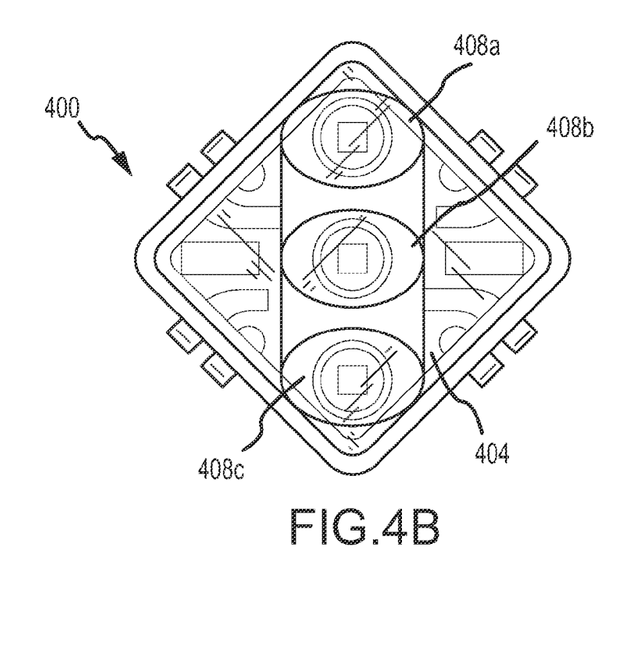
FIG. 4B is a top view of the fourth PLCC package depicted in FIG. 4A.
Figure 4C:
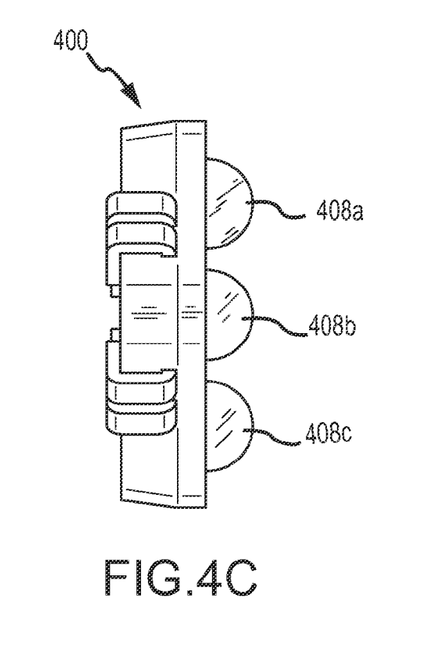
FIG. 4C is a second side view of the fourth PLCC package depicted in FIG. 4A.

FIGS. 4A-C depict a fourth PLCC package 400 that is similar to the other packages described herein except that the fourth PLCC package 400 comprises a plurality of discrete lenses 408*a*, 408*b*, 408*c*. The fourth PLCC package 400 may be substantially similar to the third PLCC package 300 and may be constructed with similar techniques except that a different mold is used to discretely form the lenses 408*a*, 408*b*, 408*c* over each of the light sources 120. In some embodiments, the lenses 408*a*, 408*b*, 408*c* are formed with an encapsulant 404 that also fills the rest of the cavity in the upper part of the housing 112. It should be appreciated that the materials used for the encapsulant 404 may be similar or identical to the materials used for any other encapsulant described herein.

In some embodiments, each light source 120 may have its own dedicated lens 408. In other embodiments, one or more of the light sources 120 may have their one dedicated lens 408 whereas other lights sources 120 may have a shared lens 308 or no lens.

It should be appreciated that the shape of the dedicated lenses 408 do not necessarily have to be dome shaped as depicted. Rather, any desired shape to accommodate lighting preferences can be used without departing from the scope of the present disclosure.

Figure 5:
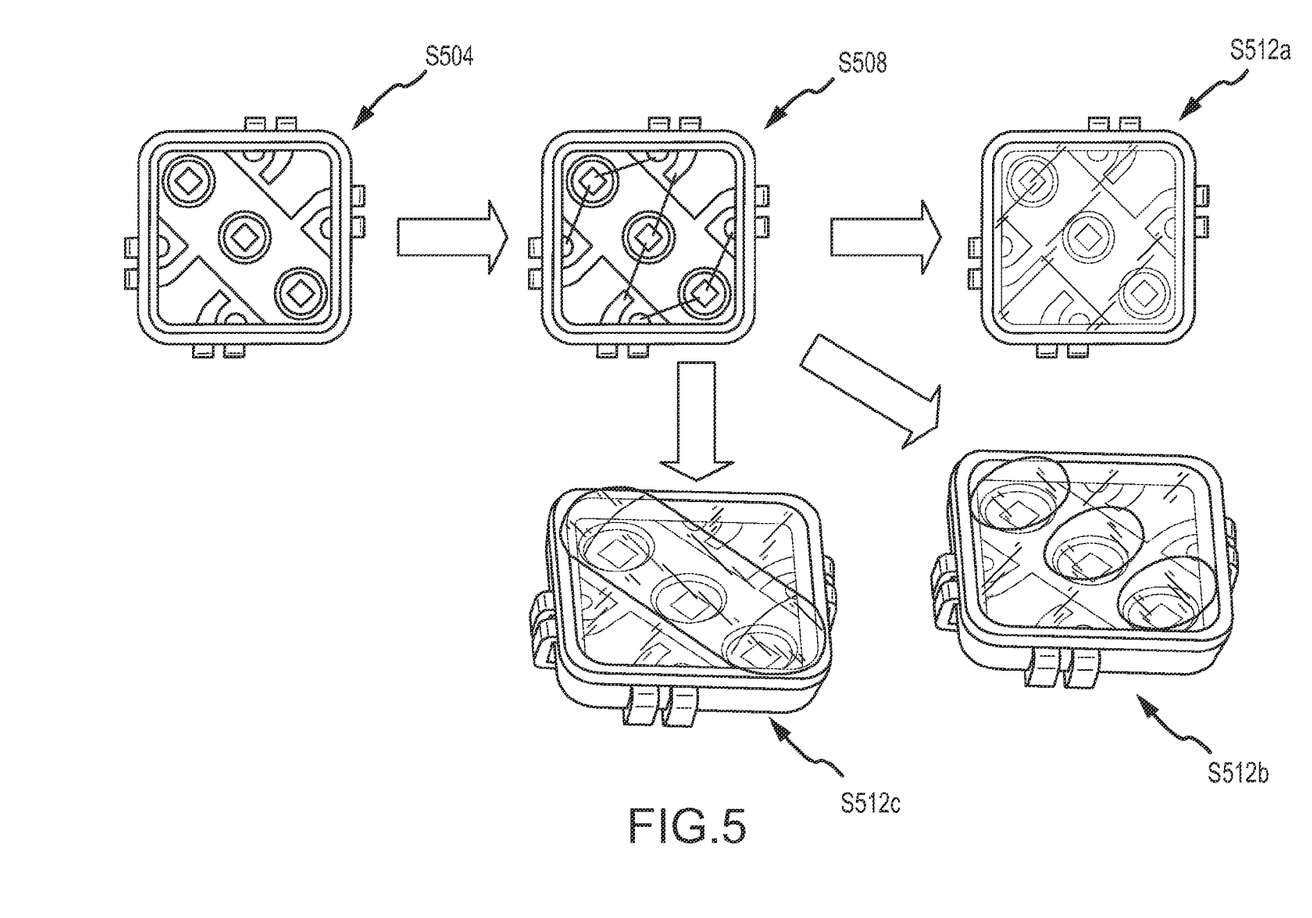
FIG. 5 depicts a process for manufacturing a PLCC package in accordance with embodiments of the present disclosure.

With reference now to FIG. 5, a process of constructing any of the PLCC packages will be described in accordance with at least some embodiments of the present disclosure. Although the steps depicted in FIG. 5 are shown in a particular order, those of ordinary skill in the LED manufacturing arts will appreciate that certain steps may be combined and/or the order of steps may be altered without departing from the scope of the present disclosure.

Initially, a lead frame 104 having one or more leads 108 may be formed. The construction of the lead frame 104 may also involve forming the reflector cups 116 on the mounting section 110 and creating any other features of the lead frame 104 that will be needed in subsequent manufacturing steps.

Once the lead frame 104 has been created, the housing 112 may be established around the lead frame 104 (step S504). In some embodiments, the housing 112 may be formed with a plastic injection molding process, in which case the plastic housing 112 may comprise a single piece of plastic. However, it may also be possible to construct the housing 112 with one, two, three, or more separate parts that are connected to one another using a bonding or fusing process or agent (e.g., gluing, welding, etc.).

Thereafter, or possibly before the establishment of the housing 112, the light sources 120 may be mounted or connected to mounting section 110 of the lead frame 104 (step S508). The manner in which the light sources 120 are mounted to the mounting section 110 may depend on the nature of the light source 120 (e.g., depending upon the relative position of the anode and cathode of the light source 120). This step may also include electrically connecting the light sources 120 to the lead frame 104 via one or more bonding wires. In some embodiments, each light source is connected to leads 108 that are physically and electrically separated from the mounting section 110 by the material of the housing 112.

The method continues by providing the encapsulant into the cavity of the upper part of the housing 112, substantially covering the light sources 120, their bonding wires, and the parts of the lead frame 104 that are exposed at the top light-emitting surface 136 of the package (steps S512*a*, S512*b*, S512*c*). As denoted by the multiple arrows emanating from step S508, the encapsulant may be configured to have a flat or planar upper surface (step S512*a*), a plurality of discrete lenses (step S512*b*), and/or a shared lens (step S512C). The encapsulant may be provided using known injection techniques, molding techniques, or the like. In some embodiments, the encapsulant hermetically seals the light sources 120 in their respective reflector cups 116 and protects the bonding wires from shifting and/or breaking.

As can be appreciated, the PLCC package may be manufactured individually or in a batch manufacturing process where each step described above is simultaneously performed on a plurality of PLCC packages. When manufacturing in bulk, additional steps such as trimming, singulating, etc. where multiple individual PLCC packages are obtained from a single lead frame sheet having multiple lead frames.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A Plastic Leaded Chip Carrier (PLCC) package, comprising:
   a lead frame, comprising:
      a mounting section configured to support two or more light sources, the mounting section comprising a length and width that is less than its length; and
      at least one lead;
   a housing having a first corner and a second corner that is diagonally-disposed relative to the first corner and that is separated from the first corner by at least two edges of the housing, wherein the length of the mounting section of the lead frame extends longitudinally between the first corner and second corner and wherein the length of the mounting section is longer than any of the at least two edges of the housing.

2. The PLCC package of claim 1, further comprising:
   two or more light sources, each of the two or more light sources being secured to the mounting section along a line drawn from the first corner to the second corner.

3. The PLCC package of claim 2, wherein the two or more light sources include a first light source, a second light source, and a third light source.

4. The PLCC package of claim 3, wherein the first light source is configured to produce light of a first color, wherein the second light source is configured to produce light of a second color, and wherein the third light source is configured to produce light of a third color.

5. The PLCC package of claim 3, wherein the at least one lead comprises a first lead, a second lead, a third lead, a fourth lead, a fifth lead, and a sixth lead, wherein the first light source is electrically connected to the first lead and the second lead, wherein the second light source is electrically connected to the third lead and the fourth lead, and wherein the third light source is electrically connected to the fifth lead and the sixth lead.

6. The PLCC package of claim 2, wherein the lead frame comprises two or more reflector cups, wherein each light source in the two or more light sources is mounted in a different reflector cup.

7. The PLCC package of claim 2, further comprising:
an encapsulant that covers the mounting section, each of the two or more light sources, and bonding wires that electrically connect the two or more light sources to the lead frame.

8. The PLCC package of claim 7, wherein the encapsulant comprises a substantially planar top surface.

9. The PLCC package of claim 7, wherein the encapsulant comprises at least one lens feature.

10. The PLCC package of claim 9, wherein the at least one lens feature is a shared lens.

11. The PLCC package of claim 9, wherein the at least one lens feature corresponds to two or more discrete lenses.

12. The PLCC package of claim 7, wherein the encapsulant comprises at least one of epoxy, silicone, a hybrid of silicone and epoxy, phosphor, a hybrid of phosphor and silicone, an amorphous polyamide resin or fluorocarbon, glass, and plastic.

13. The PLCC package of claim 1, further comprising at least one via established through the housing that is filled with an encapsulant that also encapsulates the two of more light sources.

14. A multi-light source Plastic Leaded Chip Carrier (PLCC) package, comprising:
a plastic housing including a first side edge, a second side edge, a third side edge, and a fourth side edge, the plastic housing also including a first corner that connects the first side edge and the second side edge, a second corner that connects the second side edge and the third side edge, a third corner that connects the third side edge and the fourth side edge, and a fourth corner that connects the fourth side edge and the first side edge;
a lead frame including a mounting section that completely extends from the first corner to the third corner, the lead frame also including at least one lead;
a first light source positioned at a first location on the mounting section of the lead frame; and
a second light source positioned at a second location on the mounting section of the lead frame.

15. The PLCC package of claim 14, wherein the first side edge is substantially parallel to the third side edge and wherein the second side edge is substantially parallel to the fourth side edge.

16. The PLCC package of claim 15, wherein the first, second, third, and fourth side edges are substantially the same length and wherein the mounting section of the lead frame is longer than any of the first, second, third, or fourth side edges.

17. The PLCC package of claim 14, further comprising a third light source positioned at a third location on the mounting section of the lead frame.

18. The PLCC package of claim 17, wherein the first, second, and third locations substantially coincide with a line drawn from the first corner to the third corner.

19. The PLCC package of claim 17, wherein each of the first, second, and third light sources correspond to a Light Emitting Diode, wherein the first light source is mounted in a first reflector cup established on the mounting section, wherein the second light source is mounted in a second reflector cup established on the mounting section, and wherein the third light source is mounted in a third reflector cup established on the mounting section.

20. The PLCC package of claim 14, further comprising an encapsulant that substantially fills a cavity established on an upper part of the housing, wherein the encapsulant also covers the first light source and second light source, and wherein the encapsulant hermetically seals the first light source and the second light source.

* * * * *